United States Patent
Yoon et al.

(10) Patent No.: US 6,657,175 B2
(45) Date of Patent: Dec. 2, 2003

(54) TFT TYPE OPTICAL DETECTING SENSOR IMPLEMENTING SMALL-SIZED DRIVE IC

(75) Inventors: Tae-Hwan Yoon, Kyonggi-do (KR); Jae-Kyun Lee, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 49 days.

(21) Appl. No.: 09/940,627

(22) Filed: Aug. 29, 2001

(65) Prior Publication Data

US 2002/0027188 A1 Mar. 7, 2002

(30) Foreign Application Priority Data

Sep. 1, 2000 (KR) ........................ 2000-51747

(51) Int. Cl.⁷ ............................ H01J 40/14; H01L 27/14
(52) U.S. Cl. ...................... 250/208; 250/214.1; 257/72; 382/124
(58) Field of Search .......................... 250/208.1, 208.2, 250/214.1, 214 R, 553, 556; 257/72; 356/71; 382/124–127, 312

(56) References Cited

U.S. PATENT DOCUMENTS

| | | | | |
|---|---|---|---|---|
| 5,164,714 A | * | 11/1992 | Wehrer ........................ 250/221 |
| 5,283,425 A | * | 2/1994 | Imamura .................. 250/208.1 |
| 5,525,813 A | * | 6/1996 | Miyake et al. ............ 250/208.1 |
| 5,814,872 A | * | 9/1998 | Noda et al. .................. 257/448 |
| 5,991,467 A | * | 11/1999 | Kamiko .................... 250/208.1 |
| 6,130,455 A | * | 10/2000 | Yoshinouchi et al. ........ 257/347 |
| 6,215,154 B1 | * | 4/2001 | Ishida et al. ................. 257/347 |
| 6,424,012 B1 | * | 7/2002 | Kawasaki et al. ........... 257/350 |

FOREIGN PATENT DOCUMENTS

KR 1996-9299 7/1996

OTHER PUBLICATIONS

Communication from Korean Intellectual Property Office dated May 31, 2002.

* cited by examiner

*Primary Examiner*—Stephone B. Allen
(74) *Attorney, Agent, or Firm*—Morgan, Lewis & Bockius LLP

(57) ABSTRACT

A thin film transistor-type optical detecting sensor includes an array substrate provided with a plurality of regions, each region including a plurality of sensor thin film transistors each generating an optical current in response to light reflected from a subject for detection, a plurality of storage capacitors each connected with a corresponding one of the plurality of sensor thin film transistors to store charge representative of the optical current, a plurality of switch thin film transistors each connected with a corresponding one of the plurality of storage capacitors for selectively outputting the stored charge, and a plurality of output lines each connected with a corresponding one of the plurality of switch thin film transistors, a backlight unit disposed beneath the array substrate to provide the light to the plurality of regions, and a drive IC including a plurality of sub-circuits, wherein an $n^{th}$ sub-circuit is connected with an $n^{th}$ output line of each region of the array substrate.

22 Claims, 3 Drawing Sheets

TFT TYPE OPTICAL DETECTING SENSOR IMPLEMENTING SMALL-SIZED DRIVE IC

This application claims the benefit of Korean patent application No. 2000-51747, filed Sep. 1, 2000 in Korea, which is hereby incorporated by reference in its entirety.

BACKGROUND OF THE INVENTION

1. Field of the Invention

The present invention relates to an optical detecting sensor, and more particularly, to a thin film transistor (TFT) type optical detecting sensor using a small-sized drive integrated circuit (IC).

2. Discussion of the Related Art

Generally, optical detecting sensors are used in facsimile and digital copying machines, and in fingerprint recognition systems as an image reader. The optical detecting sensor stores electric charge in accordance with an intensity of light that is reflected from a detecting subject, and then outputs the electric charge via a drive circuit. In recent years, a TFT-type optical detecting sensor has been suggested in which the TFT changes its electrical characteristics in response to incident light.

The TFT-type optical sensor includes a light source that generates light, a window that introduces the light to a subject for detection, a sensor TFT, a storage capacitor, and a switch TFT. The sensor TFT generates an optical current in accordance with the intensity of the light reflected from the subject, and the storage capacitor receives the optical current and stores an electric charge indicative of the optical current. This electric charge represents reflected light intensity data. Then, the switch TFT transfers there reflected intensity light data from the storage capacitor to a main system in accordance with a control signal received from an exterior circuit.

FIG. 1 shows a conventional TFT-type optical sensor including an array substrate 1, and a backlight unit 2 disposed beneath the array substrate 1. The array substrate 1 detects the presence of a subject, stores data for related to the subject, and transmits the data to a main system (not shown), such as the fingerprint recognition system, for example. The backlight unit 2 provides light to the array substrate 1. At this point, the array substrate 1 includes a plurality of unit pixels "P" (in FIG. 2) each having a sensor TFT "T1" (in FIG. 2), a storage capacitor "C" (in FIG. 3), and a switch TFT "T2" (in FIG. 2).

FIGS. 2 and 3 show the unit pixel "P" of the array substrate 1 (in FIG. 1) of the conventional TFT-type optical sensor. As shown, a sensor gate line 21, a sensor data line 61, a switch gate line 25, and a switch data line 65 help to define the unit pixel "P." The sensor gate line 21 and the sensor data line 61 are formed orthogonal to each other so as to cross each other, and the switch gate line 25 and the switch data line 65 are spaced apart from the sensor gate line 21 and the sensor data line 61, respectively.

The unit pixel "P" is divided into a photo-sensing region "A," a storing region "B," and a switching region "C," all which are formed on a transparent substrate 10. A sensor gate electrode 22, a first storage electrode 24, and a switch gate electrode 26 are disposed in the photo-sensing region "A," the storing region "B," and the switching region "C," respectively. The sensor gate electrode 22 and the switch gate electrode 26 integrally protrude from the sensor gate line 21 and the switch gate line 25, respectively. Alternatively, parts of the sensor gate line 21 and the switch gate line 25 may not protrude, but used as the sensor gate electrode 22 and the switch gate electrode 26, respectively. The first storage electrode 24 integrally protrudes from the sensor gate line 21.

In FIG. 3, a first insulating layer 30 covers the sensor electrode 22, the first storage electrode 24, and the switch gate electrode 26. On the first insulating layer 30, a sensor silicon layer 41 and a switch silicon layer 42 are formed in the sensing region "A" and the switching region "B," respectively. A sensor ohmic contact layer 52 and a switch ohmic contact layer 54 are formed on portions of the sensor silicon layer 41 and the switch silicon layer 42, respectively. A sensor source electrode 62 and a sensor drain electrode 63 are formed over the sensor silicon layer 41, and a switch source electrode 66 and a switch drain electrode 67 are formed over the switch silicon layer 42. A first storage electrode 24 integrally protrudes from the sensor gate line 21 toward the unit pixel region "P." The sensor source electrode 62 is connected with the sensor data line 61, and the sensor drain electrode 63 is spaced apart from the sensor source electrode 62 with the sensor gate electrode 22 centered therebetween. The switch source electrode 66 is connected with the switch data line 65, and the switch drain electrode 67 is spaced apart from the switch source electrode 65 with the switch gate electrode 26 centered therebetween. A second storage electrode 64 is formed connecting the switch drain electrode 67 and the sensor drain electrode 63, and the second storage electrode 64 overlaps the first storage electrode 24.

A second insulating layer 70 covers the sensor source electrode 62, the sensor drain electrode 63, the second storage electrode 64, the switch source electrode 66, and the switch drain electrode 67. A shielding pattern 80 that can be made of an opaque material is formed on the second insulating layer 70 over the switch silicon layer 42.

As shown in FIG. 4, the array substrate 1, having the unit pixels "P" as shown in FIG. 2, is connected with a plurality of output lines 92 that are electrically connected with a drive integrated circuit (IC) 93. Specifically, each switch data line 65 of FIG. 2 in the array substrate 1 is electrically connected with a corresponding output line 92. Therefore, when the switch TFT "T2" (in FIG. 2) switches data, the data is transferred to the drive IC 93 via the output line 92, such that the main system (not shown) can read the data from the drive IC 93.

When the backlight unit 2 of FIG. 1 is switched on to produce light, the sensor TFT "T1" of FIG. 2 generates data representative of reflected light, and the storage capacitor "C" of FIG. 3 stores the data. Then, the switch TFT "T2" of FIG. 2 switches the data in accordance with a control signal received from an exterior circuit (not shown). The switched data is subsequently transferred to the drive IC 93 via the switch data line 65 of FIG. 2 and the output line 92.

As previously mentioned, each of the plurality of data lines 65 of FIG. 2 are correspondingly connected with the same number of output lines 92. Moreover, the drive IC 93 may have a plurality of sub-circuits (not shown) each connecting with a corresponding output line 92. In other words, the drive IC 93 of the conventional TFT-type optical detecting sensor has the same number of sub-circuits as the plurality of output lines 92. Accordingly, the drive IC 93 may be very large in size and very complicated to manufacture, thereby creating high material cost and low manufacturing yield.

SUMMARY OF THE INVENTION

Accordingly, the present invention is directed to a TFT-type optical detecting sensor that substantially obviates one or more of problems due to limitations and disadvantages of the related art.

An object of the present invention is to provide an improved TFT type optical sensor implementing a small-sized drive IC.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor (TFT) type optical detecting sensor includes an array substrate provided with a plurality of regions, each region including a plurality of sensor thin film transistors each generating an optical current in response to light reflected from a subject for detection, a plurality of storage capacitors each connected with a corresponding one of the plurality of sensor thin film transistors for storing charge representative of the optical current, a plurality of switch thin film transistors each connected with a corresponding one of the plurality of storage capacitors for selectively outputting the stored charge, and a plurality of output lines each connected with a corresponding one of the plurality of switch thin film transistors, a backlight unit disposed beneath the array substrate to provide the light to the plurality of regions, and a drive IC including a plurality of sub-circuits, wherein an $n^{th}$ sub-circuit is connected with an $n^{th}$ output line of each region of the array substrate.

In another aspect, a thin film transistor-type optical detecting sensor includes an array substrate provided with a plurality of regions, each region including a plurality of sensor thin film transistors each generating an optical current in response to light reflected from a subject for detection, a plurality of storage capacitors each connected with a corresponding one of the plurality of sensor thin film transistors to store charge representative of the optical current, a plurality of switch thin film transistors each connected with a corresponding one of the plurality of storage capacitors to selectively output the stored charge, and a plurality of output lines each connected with a corresponding one of the plurality of switch thin film transistors.

In another aspect, a method for manufacturing a thin film transistor optical detecting sensor includes the steps of providing an array substrate with a plurality of regions, each region including a plurality of sensor thin film transistors each generating an optical current in response to light reflected from a subject for detection, a plurality of storage capacitors each connected with a corresponding one of the plurality of sensor thin film transistors for storing charge representative of the optical current, a plurality of switch thin film transistors each connected with a corresponding one of the plurality of storage capacitors for selectively outputting the stored charge, and a plurality of output lines each connected with a corresponding one of the plurality of switch thin film transistors, providing a backlight unit beneath the array substrate for providing the light for the plurality of regions, and providing a drive IC including a plurality of sub-circuits, wherein an $n^{th}$ sub-circuit is connected with an $n^{th}$ output line of each region of the array substrate.

In another aspect, a method of manufacturing an array substrate includes the steps of providing the array substrate with a plurality of regions, providing each of the plurality of regions with a plurality of sensor thin film transistors each generating an optical current in response to light reflected from a subject for detection, providing each of the plurality of regions with a plurality of storage capacitors each connected with a corresponding one of the plurality of sensor thin film transistors for storing charge representative of the optical current, providing each of the plurality of regions with a plurality of switch thin film transistors each connected with a corresponding one of the plurality of storage capacitors for selectively outputting the stored charge, and providing each of the plurality of regions with a plurality of output lines each connected with a corresponding one of the plurality of switch thin film transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiment of the present invention, which is illustrated in the accompanying drawings.

Figure 1:
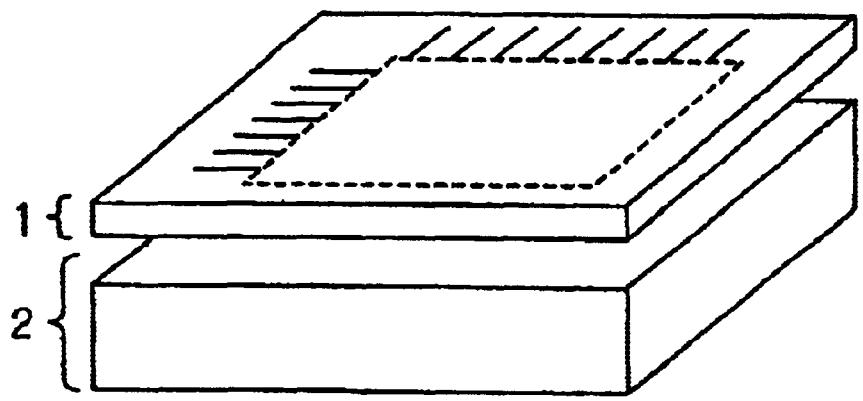
FIG. 1 is a perspective view showing a conventional TFT-type optical sensor.
Figure 2:
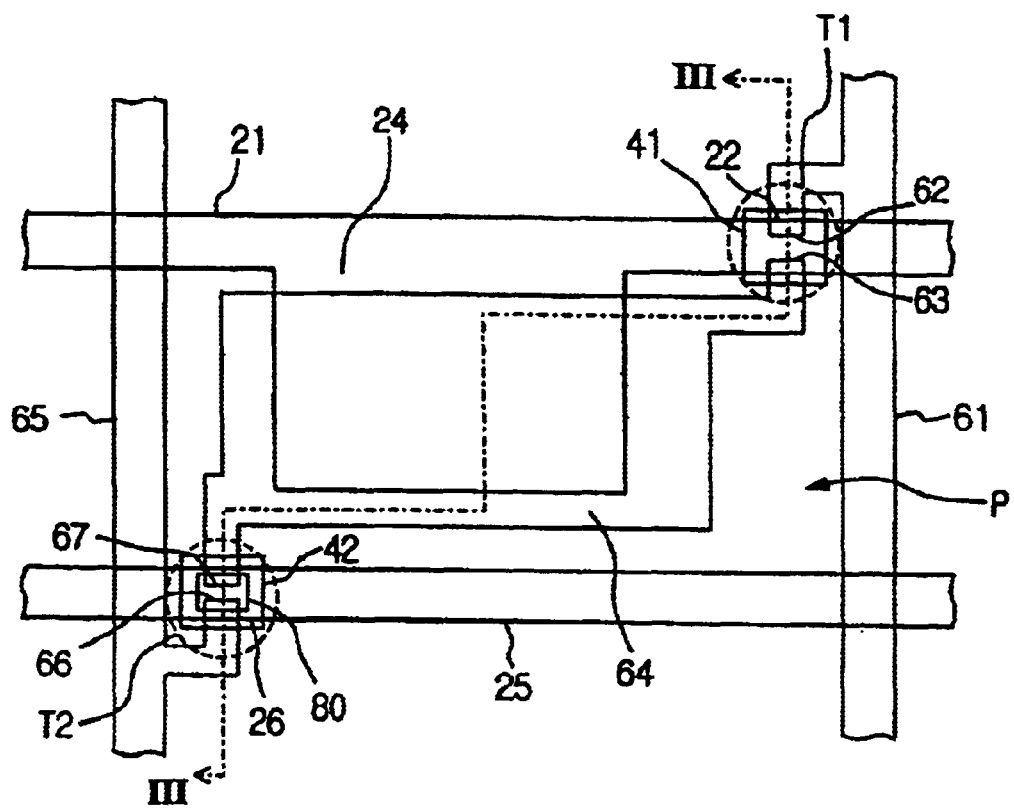
FIG. 2 is a plan view showing a unit pixel of the conventional TFT type optical sensor.
Figure 3:
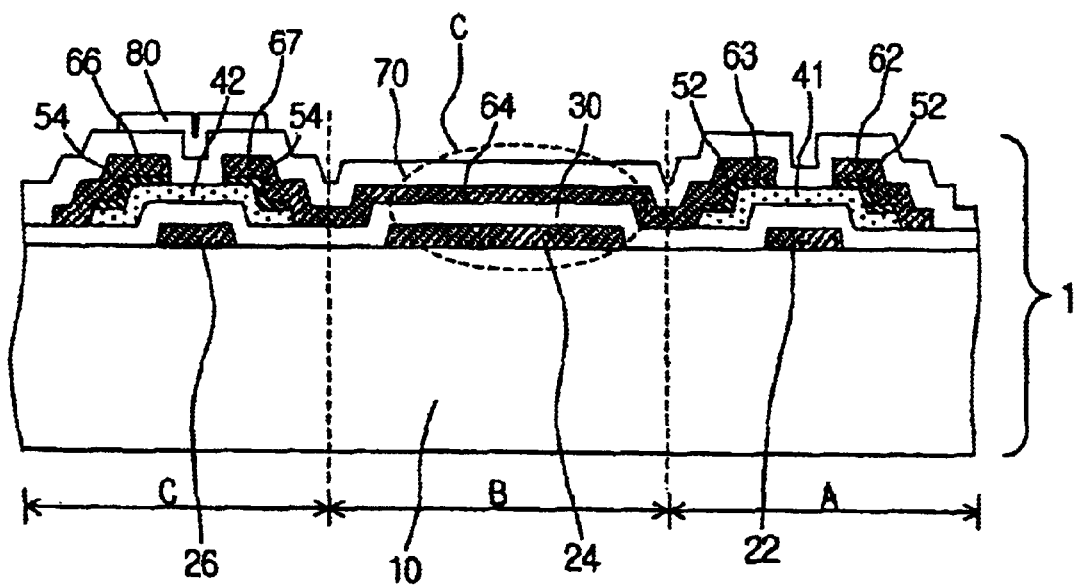
FIG. 3 is a cross-sectional view taken along a line "III—III" of FIG. 2.
Figure 4:
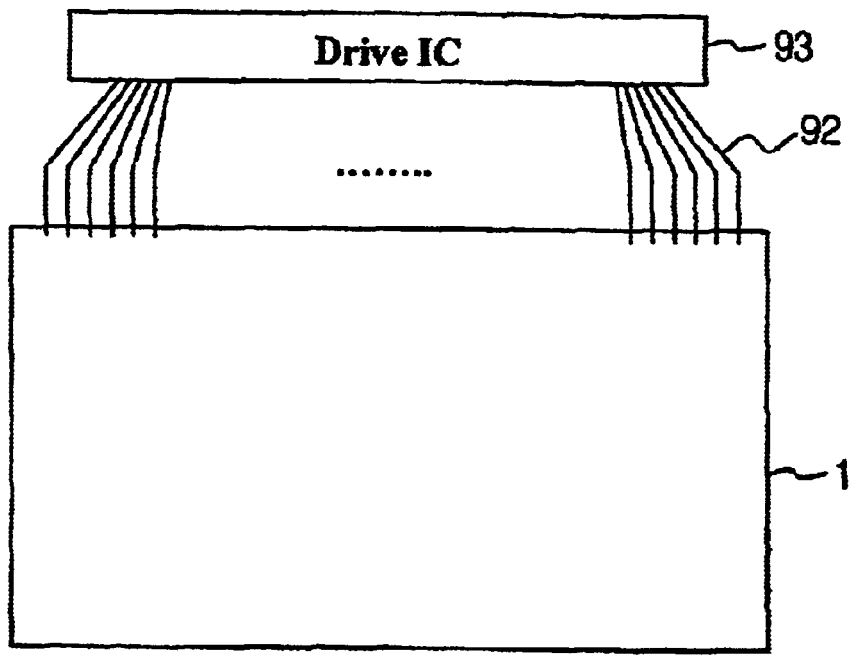
FIG. 4 is a plan view showing an interconnection of a drive IC and an array substrate of the conventional TFT-type optical sensor.
Figure 5:
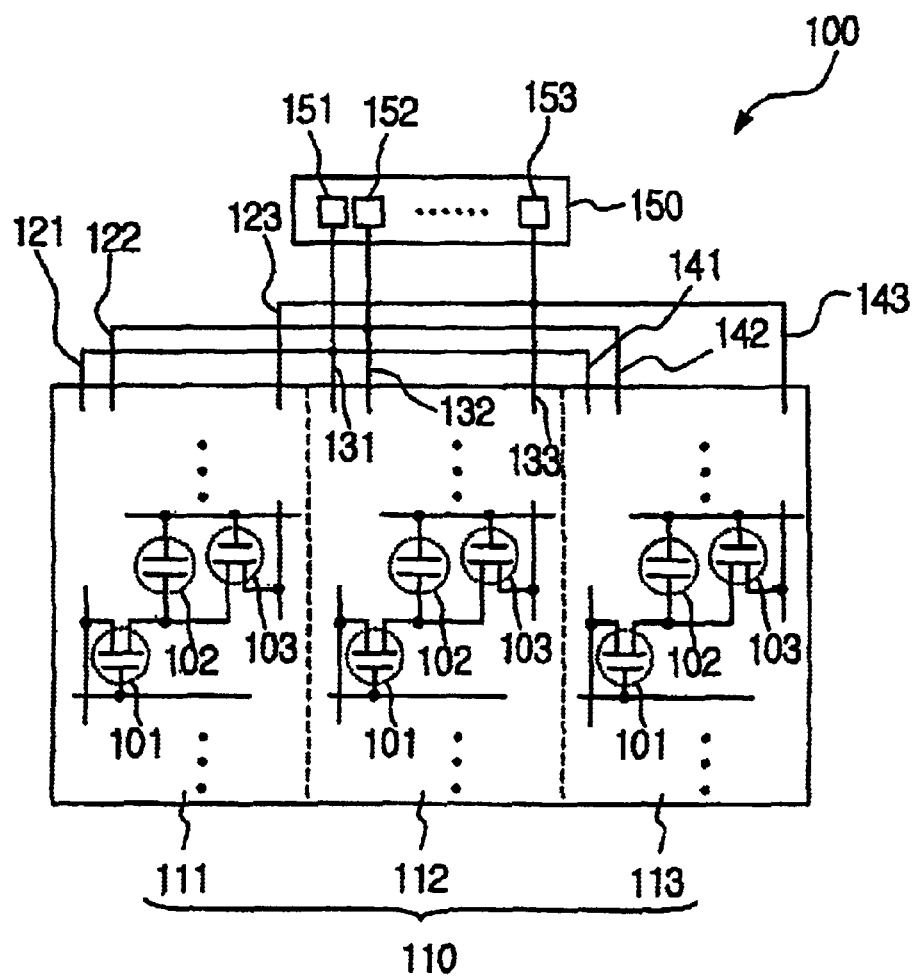
FIG. 5 is a plan view showing an interconnection of a drive IC and an array substrate of a TFT-type optical sensor according to the present invention.
Figure 6:
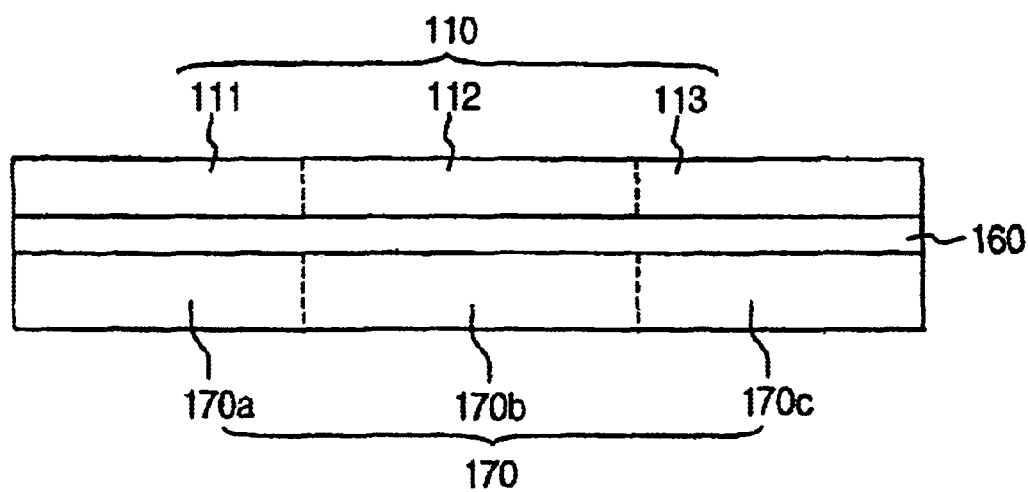
FIG. 6 is a cross-sectional view of the TFT type optical sensor of FIG. 5.

In FIG. 5, an array substrate 110 of a TFT optical detecting sensor 100 according to the invention includes a first region 111, a second region 112, and a third region 113, with a backlight unit 170 which is shown in FIG. 6, disposed beneath the array substrate 110. In addition, a plurality of sensor thin film transistors 101, a plurality of storage capacitors 102, and a plurality of switch thin film transistors 103 are formed within each of the first, second, and third regions 111, 112, and 113. The plurality of storage capacitors 102 are connected with a corresponding one of the plurality of sensor thin film transistors, and the plurality of switch thin film transistors 103 are each connected with a corresponding one of the plurality of storage capacitors 102.

As shown in FIG. 6, the backlight unit 170 includes a first independent backlight 170a, a second independent backlight 170b, and a third independent backlight 170c, which correspond to the first 111, second 112, and third 113 regions of the array substrate 110, respectively. The first to third independent backlights 170a to 170c provide light for the array substrate 110 and operate independently of each other. Therefore, the first to third regions 111 to 113 of the array substrate 110 independently receive the light from the backlight unit 170. Although the array substrate 110 is divided into three regions, the number of regions may vary. Moreover, the number of the independent backlights of the backlight unit 170 may vary in accordance with the number of regions of the array substrate 110.

Returning to FIG. 5, the TFT optical detecting sensor 100 further includes a drive IC 150 electrically connected with the plurality of switch thin film transistors 103 of the array substrate 110 via a plurality of output lines that may include a first one 121, a second one 122, a $n^{th}$ one 123, a $(n+1)^{th}$ one 131, a $(n+2)^{th}$ one 132, $2n^{th}$ one 133, a $(2n+1)^{th}$ one 141, a $(2n+2)^{th}$ one 142, and a last one 143. The first to $n^{th}$ output lines 121 to 123 may be electrically connected with the plurality of switch thin film transistors 103 of the first region 111, and the $(n+1)^{th}$ to $2n^{th}$ output lines 131 to 133 may be electrically connected with the plurality of switch thin film transistors 103 of the second region 112. The $(2n+1)^{th}$ to last output lines 141 to 143 may be electrically connected with the plurality of switch thin film transistors 103 of the third region 113. At this point, the $(n+1)^{th}$ output line 131 and the $(2n+1)^{th}$ output line 141 may serve as the first output lines of the second region 112 and the third region 113, respectively. The $2n^{th}$ output N line 133 and the last output line 143 may serve as the last output lines of the second region 112 and the third region 113, respectively. That is to say, each region may be connected with n output lines. Specifically, a plurality of switch data lines (not shown) may be formed on the array substrate 110, and each output line may electrically connect a corresponding switch data line with the drive IC 150.

The drive IC 150 may include first to $n^{th}$ sub-circuits 151 to 153. The first sub-circuit 151 may electrically connect with the first output line of each region, and the second sub-circuit 152 may electrically connect with the second output line of each region. In other words, the first sub-circuit 151 may be electrically connected with the first output line 121, the $(n+1)^{th}$ output line 131, and the $(2n+1)^{th}$ output line 141, and the second sub-circuit 152 may be electrically connected with the second output line 122, the $(n+2)^{th}$ output line 132, and the $(2n+2)^{th}$ output line 142. Like the first and second sub-circuits 151 and 152, each sub-circuit may be electrically connected with the corresponding output lines having the same relative orders with respect to each region.

Accordingly, since the array substrate 110 is divided into "m" number of regions, and each region is connected with "n" number output lines, there exists "m" by "n" (m×n) number of output lines connected with the array substrate 110. The "m" by "n" number of output lines connect the plurality of switch data lines (not shown) of the array substrate 110 with the drive IC 150. At this point, though there exist "m" by "n" number of output lines connected with the array substrate 110, just "n" number of sub-circuits are included in the drive IC 150, thereby achieving a smaller size of the drive IC 150.

Returning now to FIG. 6, an operation of the TFT optical detecting sensor is explained. After the first backlight 170a is switched on to provide light, the first region 111 generates a first set of data. The first set of data is transferred to first to $n^{th}$ sub-circuits 151 to 153 of the drive IC 150 via the first to $n^{th}$ output lines 121 to 123, and then is output to a main system (not shown) from the drive IC 150. After the first backlight 170a is switched off to cease production of light, the second backlight 170b is switched on to produce light, such that the second region 112 generates a second set of data. The second set of data is transferred to the first to $n^{th}$ sub-circuits 151 to 153 of the drive IC 150 via the $(n+1)^{th}$ to $2n^{th}$ output lines 131 to 133, and then is output to a main system (not shown) from the drive IC 150. Subsequently, the second backlight 170b is switched off to cease production of light, and the third backlight 170c is switched on to produce light, such that the third region 113 generates a third set of data. The third set of data is transferred to the first to $n^{th}$ sub-circuits 151 to 153 of the drive IC 150 via the $(2n+1)^{th}$ to last output lines 141 to 143, and then is output to a main system (not shown) from the drive IC 150.

When the first backlight 170a is switched on, it provides light only for the first region 111, and thus, sensor TFTs (not shown) formed on the first region 111 generate the first set of data. At this point, because the second and third backlights 170b and 170c are both in "off" state, sensor TFTs (not shown) of the second and third regions 112 and 113 cannot generate any data. Though the first output line 121, the $(n+1)^{th}$ output line 131, the $(2n+1)^{th}$ output line 141 are connected with the first sub-circuit 151 of the drive IC 150, they are electrically independent due to the independent switching of the first to third backlights 170a to 170c.

Each of the other output lines connected with the first region 111 also has the above-mentioned electrical independence with respect to the correspondingly positioned output lines connected with the second or third regions 112 and 113. Thus, during the "on" state of the first backlight 170a, only the first set of data is generated by the first region 111 and is transferred to the first to $n^{th}$ sub-circuits 151 to 153 of the drive IC 150 via the first to $n^{th}$ output lines 121 to 123, regardless of the other output lines connected with the same sub-circuits.

The total number of the output lines may be constant. Then, if the number of regions increases, the number of sub-circuits included in the drive IC decreases. That is, when the number of the regions is "m" and the number of the output lines connected with each region is "n," the total number of the output lines is "m" by "n" and the number of the sub-circuits is "n." At this point, because the total number "m" by "n" of the output lines may be constant, the number "n" of the sub-circuits may be decreased by increasing the number "m" of the regions. For example, if the total number of the output lines is twelve and the number of the regions is three, just four sub-circuits are needed for the drive IC according to the present invention. Moreover, redundant sub-circuits may be further included in the drive IC 150 so that when some sub-circuits malfunction, the redundant sub-circuits can be substituted for them. That is to say, the number of the sub-circuits is preferably "m+α", wherein "α" is an integer equal to or larger than 1.

Still referring to FIG. 6, a light filter 160 may be disposed between the array substrate 110 and the backlight unit 170. If light is incident normal to a surface of the light filter 160, the light can pass through the light filter 160. However, if the light is incident at an angle with respect to the surface of the light filter 160, the light will be blocked by the light filter 160 and will not pass through. Accordingly, when one of the backlights 170a to 170c is switched on, light from the switched-on backlight is provided only to the corresponding region of the array substrate 110 disposed directly above on the switched-on backlight. That is, only the light generated from the switched-on backlight disposed directly beneath the corresponding region of the array substrate 110 passes through the color filter, whereas light does not pass through the color filter in all other regions of the array substrate 110. Accordingly, each of the first to third regions 111 to 113 of the array substrate 110 can operate independently, and thus only a desired region generates data.

As above explained, according to the present invention, the array substrate of the TFT-type optical detecting sensor is divided into a plurality of regions to decrease the number of sub-circuits of the drive IC. Specifically, if the array substrate is divided into "m" regions, the number of sub-circuits is decreased to 1/m with respect to that of a conventional TFT-type optical detecting sensor. In addition, the number of bonding pads used for connecting the output lines with the array substrate is also decreased, thereby achieving lower fabrication costs, lower material costs, and higher fabrication yields.

It will be apparent to those skilled in the art that various modifications and variation can be made in the method of manufacturing a thin film transistor of the present invention without departing from the spirit or scope of the invention. Thus, it is intended that the present invention cover the modifications and variations of this invention provided they come within the scope of the appended claims and their equivalents.

What is claimed is:

1. A thin film transistor-type optical detecting sensor, comprising:

an array substrate provided with a plurality of regions, each region including a plurality of sensor thin film transistors each generating an optical current in response to light reflected from a subject for detection, a plurality of storage capacitors each connected with a corresponding one of the plurality of sensor thin film transistors for storing charge representative of the optical current, a plurality of switch thin film transistors each connected with a corresponding one of the plurality of storage capacitors for selectively outputting the stored charge, and a plurality of output lines each connected with a corresponding one of the plurality of switch thin film transistors;

a backlight unit disposed beneath the array substrate to provide the light to a single one of the plurality of regions such that the light is withheld from other ones of the plurality of regions; and a drive IC including a plurality of sub-circuits, wherein an $n^{th}$ sub-circuit is connected with an $n^{th}$ output line of each region of the array substrate.

2. The sensor according to claim 1, wherein the number of the sub-circuits is at least the same as the number of the output lines of each region.

3. The sensor according to claim 1, wherein the backlight unit includes a plurality of backlights each providing light for a corresponding one of the regions of the array substrate.

4. The sensor according to claim 3, wherein the number of backlights is the same as the number of the regions of the array substrate.

5. The sensor according to claim 1, further comprising a light filter disposed between the array substrate and the backlight unit, wherein only light normal to a surface of the light filter passes through the light filter.

6. An array substrate provided with a plurality of regions, each region comprising:

a plurality of sensor thin film transistors each generating an optical current in response to light reflected from a subject for detection;

a plurality of storage capacitors each connected with a corresponding one of the plurality of sensor thin film transistors to store charge representative of the optical current;

a plurality of switch thin film transistors each connected with a corresponding one of the plurality of storage capacitors to selectively output the stored charge; and a plurality of output lines each connected with a corresponding one of the plurality of switch thin film transistors, wherein a backlight device is positioned to provide the light to a single one of the plurality of regions such that the light is withheld from other ones of the plurality of regions.

7. The array substrate according to claim 6, further comprising:

a drive IC having a plurality of sub-circuits, wherein an $n^{th}$ number sub-circuit is connected with an $n^{th}$ number output line of each region.

8. The array substrate according to claim 7, wherein the number of the sub-circuits is at least the same as the number of the output lines of each region.

9. The array substrate according to claim 6, wherein the backlight unit includes a plurality of backlights each providing light for a corresponding one of the regions of the array substrate.

10. The array substrate according to claim 9, wherein the number of backlights is the same as the number of the regions of the array substrate.

11. The array substrate according to claim 6, further comprising a light filter disposed between the array substrate and the backlight unit, wherein only light normal to a surface of the light filter passes through the light filter.

12. A method for manufacturing a thin film transistor optical detecting sensor, comprising the steps of:

providing an array substrate with a plurality of regions, each region including a plurality of sensor thin film transistors each generating an optical current in response to light reflected from a subject for detection, a plurality of storage capacitors each connected with a corresponding one of the plurality of sensor thin film transistors for storing charge representative of the optical current, a plurality of switch thin film transistors each connected with a corresponding one of the plurality of storage capacitors for selectively outputting the stored charge, and a plurality of output lines each connected with a corresponding one of the plurality of switch thin film transistors;

providing a backlight unit beneath the array substrate for providing the light for a single one of the plurality of regions such that the light is withheld from other ones of the plurality of regions; and providing a drive IC including a plurality of sub-circuits, wherein an $n^{th}$ sub-circuit is connected with an $n^{th}$ output line of each region of the array substrate.

13. The method according to claim 12, wherein the number of the sub-circuits is at least the same as the number of the output lines of each region.

14. The method according to claim 12, wherein the backlight unit includes a plurality of backlights each providing light for a corresponding one of the regions of the array substrate.

15. The method according to claim 14, wherein the number of backlights is the same as the number of the regions of the array substrate.

16. The method according to claim 12, further comprising the step of disposing a light filter between the array substrate and the backlight unit, wherein only light normal to a surface of the light filter passes through the light filter.

17. A method of manufacturing an array substrate, comprising the steps of:

providing the array substrate with a plurality of regions;

providing each of the plurality of regions with a plurality of sensor thin film transistors each generating an optical current in response to light reflected from a subject for detection;

providing each of the plurality of regions with a plurality of storage capacitors each connected with a corresponding one of the plurality of sensor thin film transistors for storing charge representative of the optical current;

providing each of the plurality of regions with a plurality of switch thin film transistors each connected with a corresponding one of the plurality of storage capacitors for selectively outputting the stored charge; and providing each of the plurality of regions with a plurality of output lines each connected with a corresponding one of the plurality of switch thin film transistors, wherein a backlight device is positioned to provide the light to a single one of the plurality of regions such that the light is withheld from other ones of the plurality of regions.

18. The method according to claim 17, further comprising the step of:

providing a drive IC having a plurality of sub-circuits, wherein an $n^{th}$ number sub-circuit is connected with an $n^{th}$ number output line of each region.

19. The method according to claim 18, wherein the number of the sub-circuits is at least the same as the number of the output lines of each region.

20. The method according to claim 18, wherein the backlight unit includes a plurality of backlights each providing light for a corresponding one of the regions of the array substrate.

21. The method according to claim 20, wherein the number of backlights is the same as the number of the regions of the array substrate.

22. The method according to claim 18, further comprising the step of providing a light filter between the array substrate and the backlight unit, wherein only light normal to a surface of the light filter passes through the light filter.

* * * * *